(12) United States Patent
He et al.

(10) Patent No.: US 10,916,688 B2
(45) Date of Patent: *Feb. 9, 2021

(54) EUTECTIC ELECTRODE STRUCTURE OF FLIP-CHIP LED CHIP AND FLIP-CHIP LED CHIP

(71) Applicant: XIAMEN SANAN OPTOELECTRONICS TECHNOLOGY CO., LTD., Xiamen (CN)

(72) Inventors: Anhe He, Xiamen (CN); Suhui Lin, Xiamen (CN); Jiansen Zheng, Xiamen (CN); Kangwei Peng, Xiamen (CN); Xiaoxiong Lin, Xiamen (CN); Chenke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/900,538

(22) Filed: Jun. 12, 2020

(65) Prior Publication Data
US 2020/0313059 A1   Oct. 1, 2020

Related U.S. Application Data

(63) Continuation of application No. 16/409,090, filed on May 10, 2019, now Pat. No. 10,707,395, which is a
(Continued)

(30) Foreign Application Priority Data

Oct. 13, 2015 (CN) .......................... 2015 1 0655970

(51) Int. Cl.
  *H01L 29/40*   (2006.01)
  *H01L 21/00*   (2006.01)
  (Continued)

(52) U.S. Cl.
  CPC .............. *H01L 33/62* (2013.01); *H01L 24/13* (2013.01); *H01L 24/14* (2013.01); *H01L 33/40* (2013.01);
  (Continued)

(58) Field of Classification Search
  CPC ....................................... H01L 33/62
  (Continued)

(56) References Cited

U.S. PATENT DOCUMENTS 10,297,736 B2 * 5/2019 He .......................... H01L 33/62
                                                           257/778
10,707,395 B2 * 7/2020 He .......................... H01L 24/14

FOREIGN PATENT DOCUMENTS

CN            104183682    * 12/2014 ............. H01L 33/44

* cited by examiner

*Primary Examiner* — Calvin Lee
(74) *Attorney, Agent, or Firm* — Syncoda LLC; Feng Ma

(57) ABSTRACT

A light emitting diode includes: a light emitting structure including a first semiconductor layer, a light emitting layer, a second semiconductor layer; a first metal layer arranged on at least a portion of the first semiconductor layer and in contact with the first semiconductor layer; and an electrode layer arranged over the light emitting structure, and having a first electrode layer and a second electrode layer. The first electrode layer is electrically coupled to the first and second semiconductor layers; the second electrode layer is configured for bonding with a package substrate, and includes a first and second bonding regions; the first bonding region is electrically coupled to the first semiconductor layer; the second bonding region is electrically coupled to the second
(Continued)

semiconductor layer; and the first metal layer is not overlapped with the first bonding region of the second bonding region in a vertical direction.

20 Claims, 5 Drawing Sheets

Related U.S. Application Data continuation of application No. 15/853,845, filed on Dec. 24, 2017, now Pat. No. 10,297,736, which is a continuation of application No. PCT/CN2016/097758, filed on Sep. 1, 2016.

(51) Int. Cl.
*H01L 33/62* (2010.01)
*H01L 23/00* (2006.01)
*H01L 33/40* (2010.01)

(52) U.S. Cl.
CPC .............. *H01L 24/06* (2013.01); *H01L 24/16* (2013.01); *H01L 24/81* (2013.01); *H01L 2224/0401* (2013.01); *H01L 2224/06102* (2013.01); *H01L 2224/13006* (2013.01); *H01L 2224/13011* (2013.01); *H01L 2224/13016* (2013.01); *H01L 2224/13017* (2013.01); *H01L 2224/13018* (2013.01); *H01L 2224/13019* (2013.01); *H01L 2224/13082* (2013.01); *H01L 2224/14051* (2013.01); *H01L 2224/16227* (2013.01); *H01L 2224/48506* (2013.01); *H01L 2224/80805* (2013.01); *H01L 2224/81191* (2013.01); *H01L 2224/81805* (2013.01); *H01L 2225/06513* (2013.01); *H01L 2924/12041* (2013.01); *H01L 2924/37001* (2013.01); *H01L 2933/0016* (2013.01)

(58) Field of Classification Search
USPC .......................................... 438/108; 257/778
See application file for complete search history.

EUTECTIC ELECTRODE STRUCTURE OF FLIP-CHIP LED CHIP AND FLIP-CHIP LED CHIP

CROSS-REFERENCE TO RELATED APPLICATIONS

The present application is a continuation of, and claims priority to, U.S. patent application Ser. No. 16/409,090 filed on May 10, 2019, now U.S. Pat. No. 10,707,395 issued on Jul. 7, 2020, which in turn is a continuation of, and claims priority to, U.S. patent application Ser. No. 15/853,845 filed on Dec. 24, 2017, now U.S. Pat. No. 10,297,736 issued on May 21, 2019, which in turn is a continuation of, and claims priority to, PCT/CN2016/097758 filed on Sep. 1, 2016, which claims priority to Chinese Patent Application No. 201510655970.X filed on Oct. 13, 2015. The disclosures of these applications are hereby incorporated by reference in their entirety.

BACKGROUND

Flip-chip LED chips (FCs for short) have been applied in mass production due to proven excellent heat dissipation characteristics and good light extraction efficiency. However, the flip-chip LED chip is different from existing light emitting diode in packaging process. Therefore, chip design, packaging process and material matching have become one of the important topics in the flip-chip packaging technology. The packaging of flip-chip LED chip is mainly divided into two types: The first type is Au-stub bumping process. In this process, an Au-stub bumping is firstly planted over the package substrate, wherein, the relative position of the Au-stub bumping on the substrate is same as that of the chip electrode. Later, through ultrasound pressing, the chip electrode is electrically connected to the Au-stub bumping over the package substrate; this method has the advantages of low requirements for the package substrate and flexible process.

SUMMARY

The inventors of the present disclosure have recognized that the ultrasound pressing involves expensive equipment, poor production efficiency due to large consumption and high cost of Au-stub bumping and high precision of chip alignment, resulting in high cost of the entire production; the second type is eutectic bonding process, wherein, the selected eutectic metal is fabricated over the chip through evaporating or sputtering; the chip is pre-fit over the package substrate through low-temperature scaling powder, and reflowed at melting point higher than that of the eutectic metal layer so that the chip is connected to the package substrate. With low metal cost and fast production, this method has low precision requirement of machine. But it has high requirements for flatness of the eutectic metal layer over the flip-chip LED chip surface. If height difference appears over the metal layer surface, the eutectic void ratio is high, which causes poor eutectic quality and influences the package yield.

FIGS. 1 and 2 show an existing LED flip-chip structure, which is fabricated by epitaxial growth of a first semiconductor layer, a light emitting layer and a second semiconductor layer over an epitaxial substrate; depositing a transparent conducting layer; etching and exposing part of the first semiconductor layer; evaporating a metal layer (including the spreading finger); depositing an insulating layer and evaporating an AuSn eutectic electrode. However, when this structure is applied in eutectic package, as shown in FIG. 3, a bumping structure appears over the AuSn eutectic electrode surface due to the bumping metal layer (including the metal spreading finger). For example, the upper surface of the AuSn eutectic electrode of the second metal layer (including the metal spreading finger) is highest, which is available for eutectic bonding with the package substrate; however, the AuSn eutectic electrodes in other regions are low, and is difficult for eutectic bonding with the package substrate; therefore, the flatness of the eutectic electrode upper surface cannot be guaranteed, which may cause high eutectic void ratio and poor eutectic quality.

Various embodiments of the present disclosure provide a eutectic electrode structure of flip-chip LED chip and a flip-chip LED chip, which solves low package yield due to high eutectic void ratio during eutectic bonding process of the existing flip-chip LED chip structure without changing the package substrate.

According to a first aspect of the present disclosure, a eutectic electrode structure of flip-chip LED chip is provided, wherein, the eutectic electrode structure is composed of a first eutectic layer and a second eutectic layer from bottom to up at vertical direction, and is divided into a first-type electrode region and a second-type electrode region at horizontal direction, wherein, the upper surface and lower surface of the first eutectic layer are not flat, and the upper surface of the second eutectic layer is flat.

In some embodiments, the lower surface of the first eutectic layer contacts with the flip-chip LED chip for current conduction.

In some embodiments, the upper surface of the second eutectic layer is higher than or is of equal height with the upper surface of the first eutectic layer to form a flat eutectic plane.

According to a second aspect of the present disclosure, a flip-chip LED chip is provided, which includes: a substrate; a first semiconductor layer over the substrate; a light-emitting layer over the first semiconductor layer; a second semiconductor layer over the light emitting layer; a local defect region over a portion of the second semiconductor layer, the local defect region extending downward to the first semiconductor layer; a first metal layer over a portion of the first semiconductor layer; a second metal layer over a portion of the second semiconductor layer; an insulating layer covering the first metal layer, the second metal layer, the second semiconductor layer and the first semiconductor layer in the local defect region, wherein the insulating layer has opening structures over the first metal layer and the second metal layer, respectively; and a eutectic electrode structure over the insulating layer with openings, wherein the eutectic electrode structure includes a first eutectic layer and a second eutectic layer from bottom up at a vertical direction, and includes a first-type electrode region and a second-type electrode region at a horizontal direction; wherein the second eutectic layer does not overlap with the first metal layer or the second metal layer at the vertical direction.

In some embodiments, the lower surface of the first eutectic layer contacts with the first metal layer and the second metal layer respectively for current conduction.

In some embodiments, the second eutectic layer is not overlapped with the first metal layer and the second metal layer at vertical direction.

In some embodiments, the upper surface of the second eutectic layer is higher than or is of equal height with the upper surface of the first eutectic layer to form a flat eutectic plane.

In some embodiments, the second eutectic layer in the first-type electrode region is of same height with the second eutectic layer in the second-type electrode region.

In some embodiments, the first metal layer and the second metal layer are composed of metal bodies and metal spreading fingers, or the first metal layer and the second metal layer are metal bodies.

In some embodiments, the opening structure of the insulating layer is only over the metal body.

In some embodiments, the first-type electrode region and the second-type electrode region are of equivalent area and in symmetrical positions.

In some embodiments, a transparent conducting layer is formed over the second semiconductor layer, and the material can be ITO, ZnO, CTO, InO, In-doped ZnO, Al-doped ZnO or Ga-doped ZnO or any of their combinations.

In some embodiments, the metal layer material is Cr, Ti, Pt, Au, Ag, Ni, Cu, TiW or any of their combinations.

In some embodiments, the insulating layer material is $SiO_2$, $Al_2O_3$, $SiN_x$, $TiO_2$ or any of their combinations.

In some embodiments, the eutectic electrode structure material is Ti, Ni, Cu, Au, AuSn, SnCu, SnBi or any of their combinations.

In another aspect of the present disclosure, a light-emitting diode including a flip-chip LED chip is provided, in which the flip-chip LED chip further includes a substrate; a first semiconductor layer over the substrate; a light-emitting layer over the first semiconductor layer; a second semiconductor layer over the light emitting layer; a local defect region over a portion of the second semiconductor layer, the local defect region extending downward to the first semiconductor layer; a first metal layer over a portion of the first semiconductor layer; a second metal layer over a portion of the second semiconductor layer; an insulating layer covering the first metal layer, the second metal layer, the second semiconductor layer and the first semiconductor layer in the local defect region, wherein the insulating layer has opening structures over the first metal layer and the second metal layer, respectively; and a eutectic electrode structure over the insulating layer with openings, wherein the eutectic electrode structure includes a first eutectic layer and a second eutectic layer from bottom up at a vertical direction, and includes a first-type electrode region and a second-type electrode region at a horizontal direction; wherein the second eutectic layer does not overlap with the first metal layer or the second metal layer at the vertical direction.

In another aspect of the present disclosure, a light-emitting system including a plurality of light-emitting diodes (LEDs) is provided, in which each LED includes a flip-chip LED chip. The flip-chip LED chip further includes: a substrate; a first semiconductor layer over the substrate; a light-emitting layer over the first semiconductor layer; a second semiconductor layer over the light emitting layer; a local defect region over a portion of the second semiconductor layer, the local defect region extending downward to the first semiconductor layer; a first metal layer over a portion of the first semiconductor layer; a second metal layer over a portion of the second semiconductor layer; an insulating layer covering the first metal layer, the second metal layer, the second semiconductor layer and the first semiconductor layer in the local defect region, wherein the insulating layer has opening structures over the first metal layer and the second metal layer, respectively; and a eutectic electrode structure over the insulating layer with openings, wherein the eutectic electrode structure includes a first eutectic layer and a second eutectic layer from bottom up at a vertical direction, and includes a first-type electrode region and a second-type electrode region at a horizontal direction; wherein the second eutectic layer does not overlap with the first metal layer or the second metal layer at the vertical direction. The light-emitting system can be used in the fields of lighting, display, signage, etc.

Through a dual-layer eutectic electrode structure, the electrode structure design of the flip-chip LED chip of the present disclosure solves the problem of low package yield due to high eutectic void ratio during eutectic bonding process of existing chip structures, without changing the package substrate.

The other features and advantages of the present disclosure will be described in detail in the following specification, and it is believed that such features and advantages will become more obvious in the specification or through implementations of the present disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the present disclosure and constitute a part of this specification, together with the embodiments, are therefore to be considered in all respects as illustrative and not restrictive. In addition, the drawings are merely illustrative, which are not drawn to scale.

Figure 1:
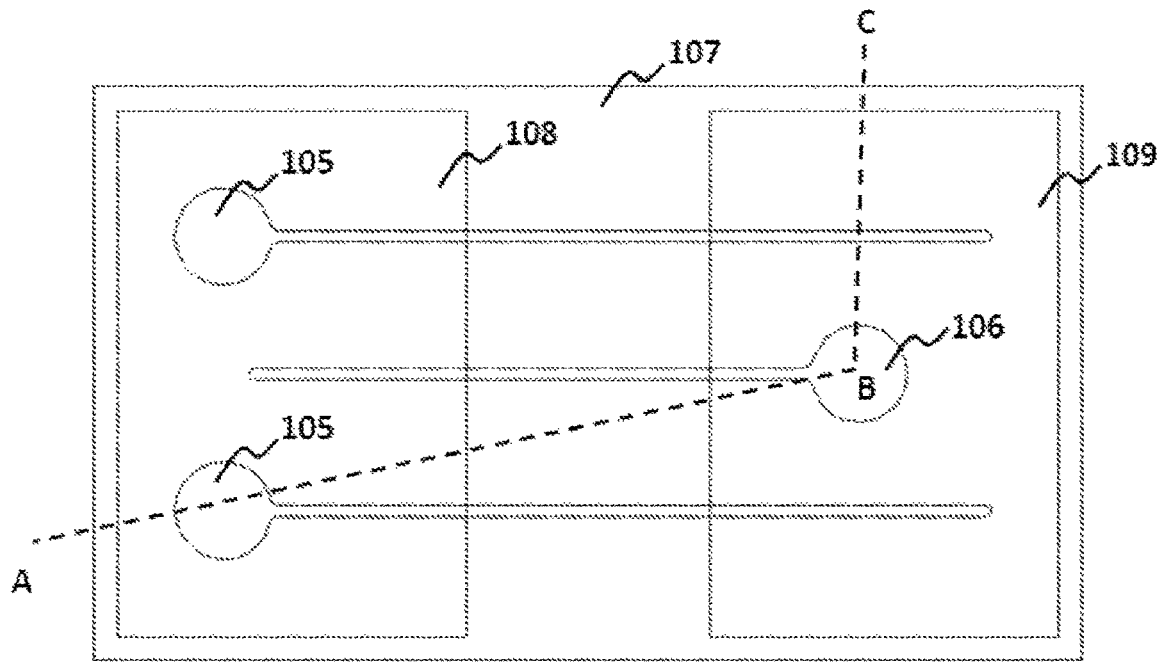
FIG. 1 illustrates a top view of an existing flip-chip LED chip structure.
Figure 2:
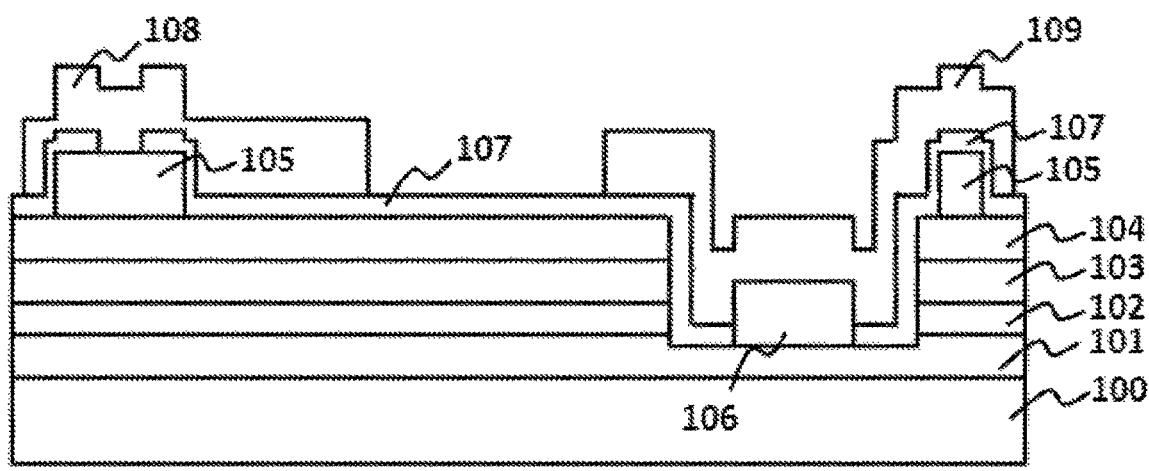
FIG. 2 illustrates a sectional view along A-B-C direction in FIG. 1.
Figure 3:
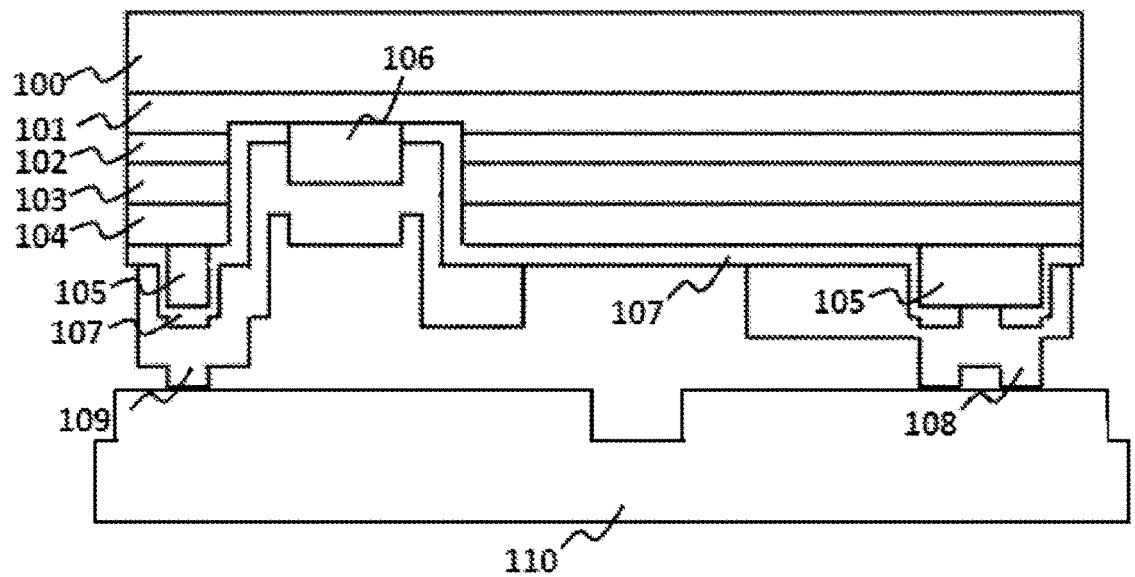
FIG. 3 illustrates a sectional view of a eutectic package of an existing flip-chip LED chip structure.

In the drawings: 100, 200, 300: substrate; 101, 201, 301: first semiconductor layer; 102, 202, 302: light emitting layer; 103, 203, 303: second semiconductor layer; 104, 204, 304: transparent conducting layer; 105, 205, 305: second metal layer; 106, 206, 306: first metal layer; 107, 207, 307: insulating layer; 108, 208, 308: second-type electrode region; 109, 209, 309: first-type electrode region; 110, 210, 310: package substrate; 2081, 2091, 3081, 3091: first eutectic layer; 2082, 2092, 3082, 3092: second eutectic layer.

DETAILED DESCRIPTION

Detailed steps and compositions will be described below for a better understanding of the present disclosure. In addition, it should be noted that well-known compositions or steps are not included to avoid unnecessary limitation to the present disclosure. Preferred embodiments of the present disclosure will be described in detail below. However, in addition to these details, the present disclosure can be widely applied to other embodiments. The scope of the present disclosure is not limited and is as defined by the appended claims.

To solve the problem of existing flip-chip LED chip during eutectic bonding process, the present disclosure provides a dual-layer eutectic electrode design applicable to the flip-chip LED chip, which solves the problem of low package yield due to high eutectic void ratio during eutectic bonding process of existing chip structures, without changing the package substrate. Various embodiments of the eutectic electrode structure and the flip-chip LED chip of the present disclosure will be described in detail with reference to the accompanying drawings.

Embodiment 1

Figure 4:
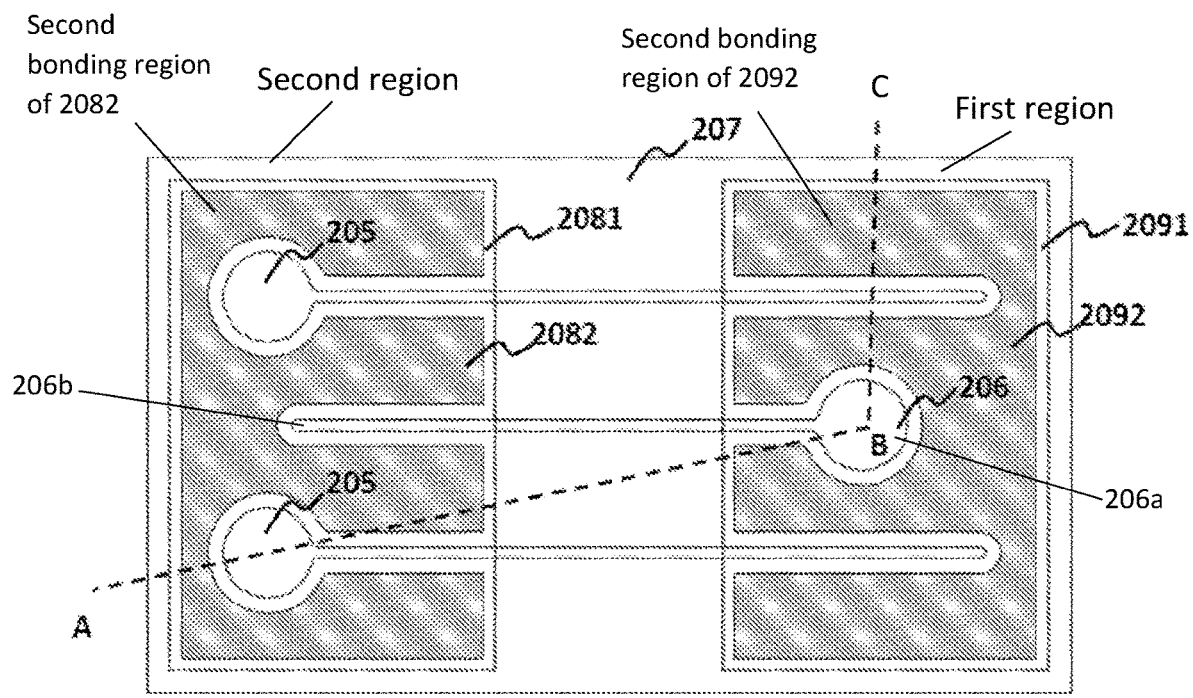
FIG. 4 illustrates a top view of a flip-chip LED chip structure according to Embodiment 1.
Figure 5:
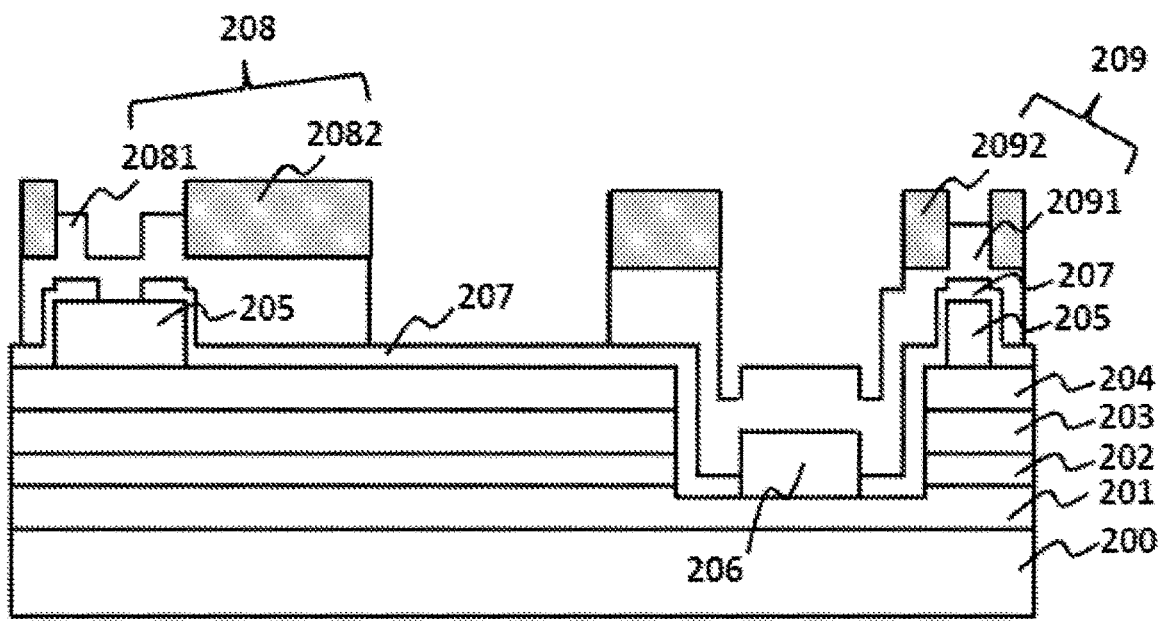
FIG. 5 illustrates a sectional view of the flip-chip LED chip in FIG. 4 along A-B-C direction.

With reference to FIGS. 4 and 5, a flip-chip LED chip of this embodiment, comprises: a substrate 200; a first semiconductor layer 201 over the substrate 200; a light emitting layer 202 over the first semiconductor layer 201; a second semiconductor layer 203 over the light emitting layer 202; a local defect region over part of the second semiconductor layer 203, which extends downward to the first semiconductor layer 201; a transparent conducting layer 204 over part of the second semiconductor layer 203; a first metal layer 206 over part of the first semiconductor layer 201; a second metal layer 205 over the transparent conducting layer 204; an insulating layer 207 over the first metal layer 206, the second metal layer 205, the transparent conducting layer 204 and the first semiconductor layer 201 in the local defect region, wherein the insulating layer has opening structures over the first metal layer 206 and the second metal layer 205 respectively; a eutectic electrode structure over the insulating layer 207 with openings, wherein, the eutectic electrode structure is composed of a first eutectic layer 2081 and 2091 and a second eutectic layer 2082 and 2092 from bottom to up at vertical direction, and is divided into a first-type electrode region 209 and a second-type electrode region 208 at horizontal direction; wherein, the first-type electrode region 209 and the second-type electrode region 208 are of equivalent area and in symmetrical positions.

In some embodiments, the substrate 200 can be a sapphire, SiC, silicon, GaN, AlN, ZnO or other substrates suitable for epitaxial growth; in this embodiment, sapphire is preferred; the first semiconductor layer 201, the second semiconductor layer 202 and the light emitting layer 203 are GaN-based materials or other materials; the transparent conducting layer 204 can be ITO, ZnO, CTO, InO, In-doped ZnO, Al-doped ZnO or Ga-doped ZnO or any of their combinations; in this embodiment, ITO is preferred.

In some embodiments, the first metal layer and the second metal layer are composed of metal bodies and metal spreading fingers, or the first metal layer and the second metal layer are metal bodies; to improve current spreading uniformity, in this embodiment, the first metal layer 206 and the second metal layer 205 prefer to be composed of circular metal bodies and strip metal spreading fingers, and the metal layer material is Cr, Ti, Pt, Au, Ag, Ni, Cu, TiW or any of their combinations or other materials.

In some embodiments, the opening structure of the insulating layer 207 can be over the circular metal bodies and the strip metal spreading fingers, or only over the circular metal bodies. In this embodiment, preferably, the insulating layer 207 is over the strip metal spreading finger, and the opening structure of the insulating layer is only over the circular metal body; In some embodiments, the insulating layer material is $SiO_2$, $Al_2O_3$, $SiN_x$, $TiO_2$ or any of their combinations; in this embodiment, a distributed Bragg reflective layer alternatively stacked by low-refractivity $SiO_2$ and high-refractivity $TiO_2$ is preferred to facilitate light reflection from the light emitting layer and increase light emitting.

The first eutectic layer 2081 is formed over the insulating layer 207 with openings, such that the lower surface of the first eutectic layer 2081 contacts with the second metal layer 205 for current conduction; the first eutectic layer 2091 is formed over the insulating layer 207 with openings such that the lower surface of the first eutectic layer 2091 contacts with the first metal layer 206 for current conduction. As the first eutectic layer 2081 and 2091 has bumping metal layers 205 and 206 at bottom, the upper and lower surfaces of the first eutectic layer 2081 and 2091 are not flat, appearing in concave-convex shape.

The second eutectic layer 2082 and 2092 are formed over the first eutectic layers 2081 and 2091 respectively, and are not overlapped with the first metal layer 205 and the second metal layer 206 at vertical direction, i.e., the second eutectic layers avoid metal electrode bodies and metal spreading fingers; the second eutectic layer is over the flat bottom region of the concave-convex upper surface of the first eutectic layer to obtain a second eutectic layer with flat upper surface; the second eutectic layer 2092 in the first-type electrode region 209 is of same height with the second eutectic layer 2082 in the second-type electrode region 208, thus forming a complete eutectic plane.

In some embodiments, with reference to FIG. 4 and FIG. 5, the opening structures include a first number of openings in the first-type electrode region 209, and a second number of openings in the second-type electrode region 208, and wherein the first number is smaller than the second number.

For example, the second-type electrode region can be a P-type region, such as P—GaN, and the first-type region can be an N-type region, such as N—GaN. Because high doping concentration is more difficult to be realized in the P-type semiconductor, the conductivity of the P-type region is not as good as that of the N-type region, and it is more difficult to form Ohmic contacts in the P-type region. To compensate for this, the areas for Ohmic contacts in the P-type region can be made larger than that for the N-type region.

In some embodiments, a ratio between the first number and the second number is in a range of 0.3-0.9. In an example, the ration can be 0.5, as illustrated in FIG. 4.

Figure 6:
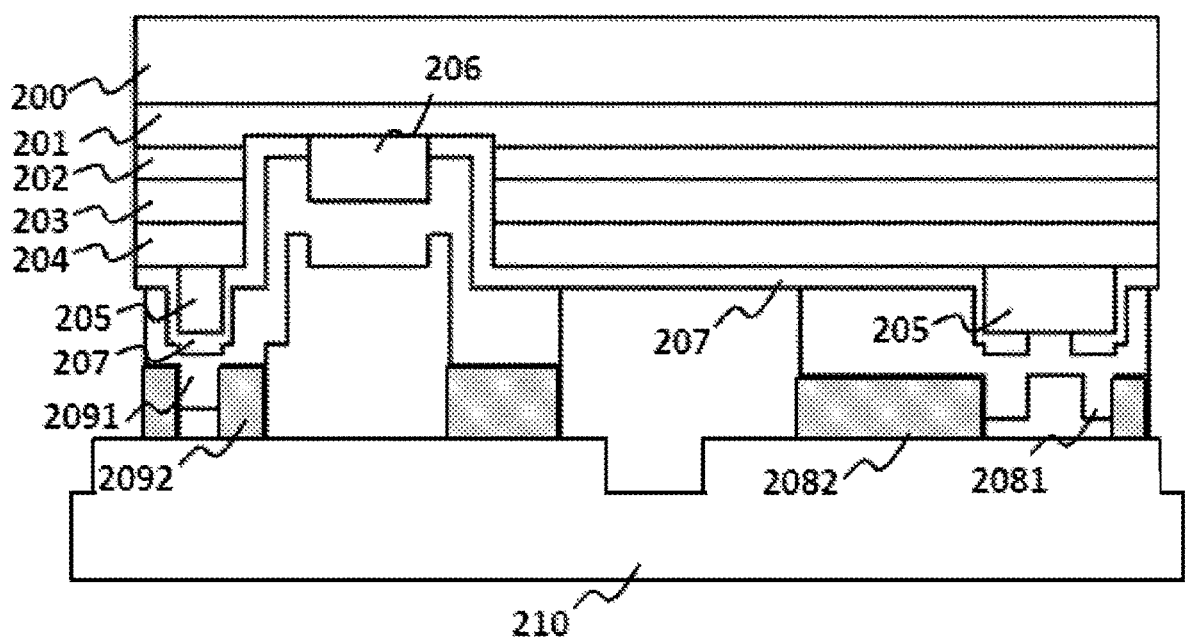
FIG. 6 illustrates a sectional view of eutectic package of a flip-chip LED chip structure according to Embodiment 1.

With reference to FIG. 6, when the flip-chip LED chip of this embodiment is used for eutectic package, the upper surface of the second eutectic layer is higher than the upper surface of the first eutectic layer, and the upper surface of the second eutectic layer are flat with same height, thus forming a complete eutectic plane, which effectively reduces void ratio during eutectic bonding of the package substrate 210. In addition, the second eutectic layer 2082 and 2092 are much larger than the first metal layer 205 and the second metal layer 206 to increase effective eutectic area and to make eutectic bonding stronger, so as to improve package yield of the flip-chip LED chip and increase current stability and uniformity.

Embodiment 2

In some embodiments, a flip-chip LED chip is provided including: a substrate; a first semiconductor layer over the substrate; a light-emitting layer over the first semiconductor layer; a second semiconductor layer over the light emitting layer; a local defect region over a portion of the second semiconductor layer, the local defect region extending downward to the first semiconductor layer; a first metal layer over a portion of the first semiconductor layer; a second metal layer over a portion of the second semiconductor layer; an insulating layer covering the first metal layer, the second metal layer, the second semiconductor layer and the first semiconductor layer in the local defect region, wherein the insulating layer has opening structures over the first metal layer and the second metal layer, respectively; and a eutectic electrode structure over the insulating layer with openings, wherein the eutectic electrode structure includes a first eutectic layer and a second eutectic layer from bottom up at a vertical direction, and includes a first-type electrode region and a second-type electrode region at a horizontal direction; wherein the second eutectic layer does not overlap with the first metal layer or the second metal layer at the vertical direction.

Figure 7:
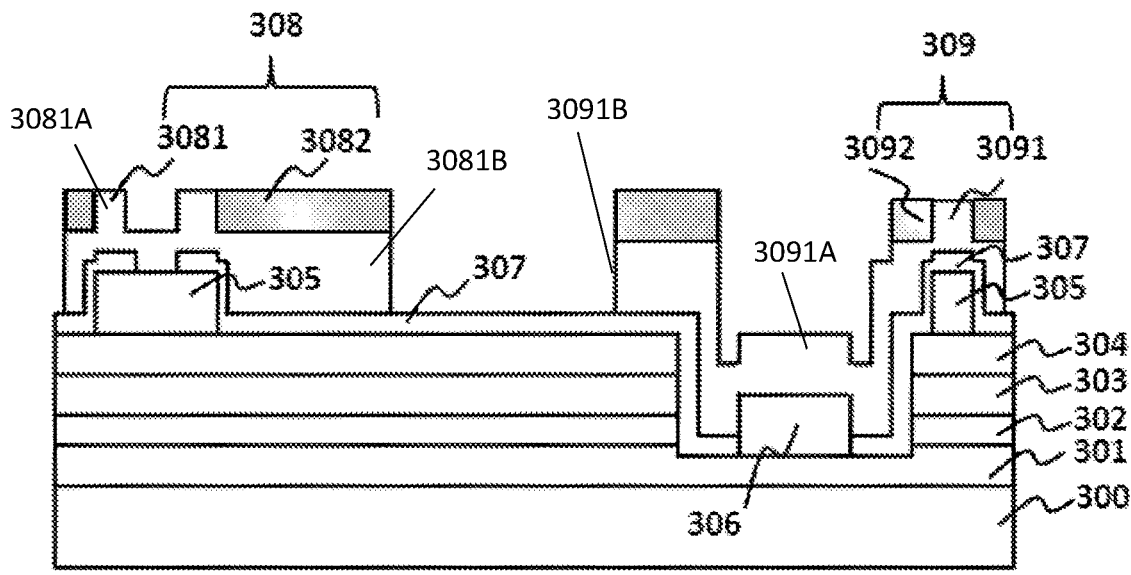
FIG. 7 illustrates a top view of a flip-chip LED chip structure according to Embodiment 2.
Figure 8:
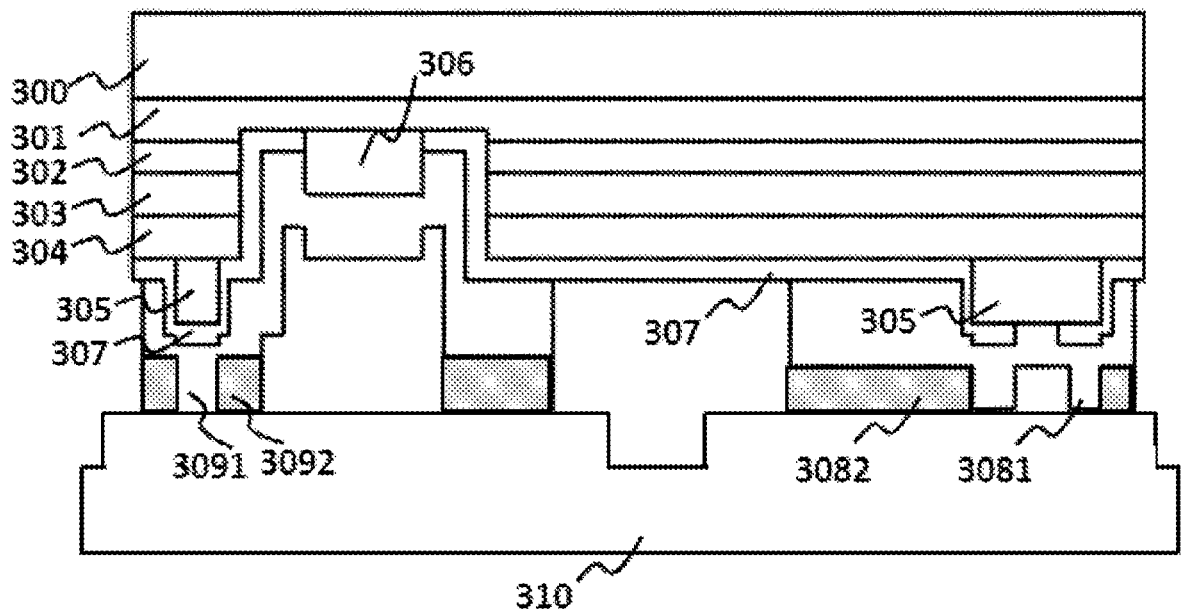
FIG. 8 illustrates a sectional view of eutectic package of a flip-chip LED chip structure according to Embodiment 2.

With reference to FIGS. 7 and 8, the differences compared with Embodiment 1 may include that: the upper surface of the second eutectic layer 3082 and 3092 are of same height with the upper surface of the first eutectic layer 3081 including a first portion 3081A and a second portion 3081B, and 3091, which further enlarges the flat upper surface of the eutectic electrode structure to make eutectic bonding stronger, and to improve package yield and current spreading uniformity.

According to the embodiments of the present disclosure, when the dual-layer eutectic electrode according to the present disclosure is applied, i.e., the first eutectic layer is used for current conduction with the semiconductor bottom layer, and the second eutectic layer avoids the bumping region of the metal layer (which may include the metal spreading finger). This solves the problem of eutectic failure due to high void ratio from electrode height difference (flatness difference) during eutectic process of existing eutectic electrode designs, so as to improve the package yield of flip-chip LED chips and current spreading uniformity.

In these embodiments, the second eutectic metal layer 3082 does not overlap with the first metal layer 305, or the first eutectic metal layer 3081 over the first metal layer 305. As a result, the outermost layer is the second eutectic metal layer 3082, and this is beneficial for the eutectic process.

In contrast, if the second eutectic layer overlaps with the first metal layer and the first eutectic layer, the outermost layer would be only part of the second eutectic layer that is on the first metal layer. Because usually the first metal layer area is small, this is not good for the eutectic process.

Figure 9:
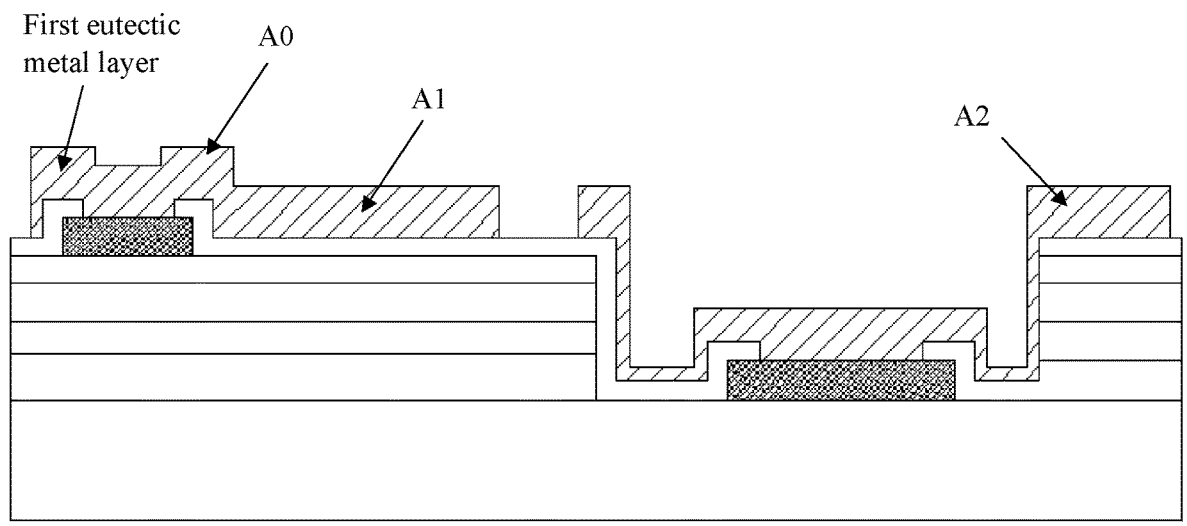
FIG. 9 illustrates a sectional view of a configuration where the second eutectic layer overlaps with the first metal layer and the first eutectic layer according to some embodiments.

FIG. 9 illustrates a sectional view of a configuration where the second eutectic layer overlaps with the first metal layer and the first eutectic layer according to some embodiments. As shown, the second eutectic layer would overlap with the first metal layer and the first eutectic layer at the portion "A0" of the first eutectic layer. As such, the top layer of the chip pad would be at the area "A0" that usually is a small area above the first metal layer, and protrudes above the top layer. Other areas of the pads, A1, A2 would be lower than the area A and therefore cannot come into contact with the package substrate, resulting in detrimental effects on the eutectic process.

Figure 10:
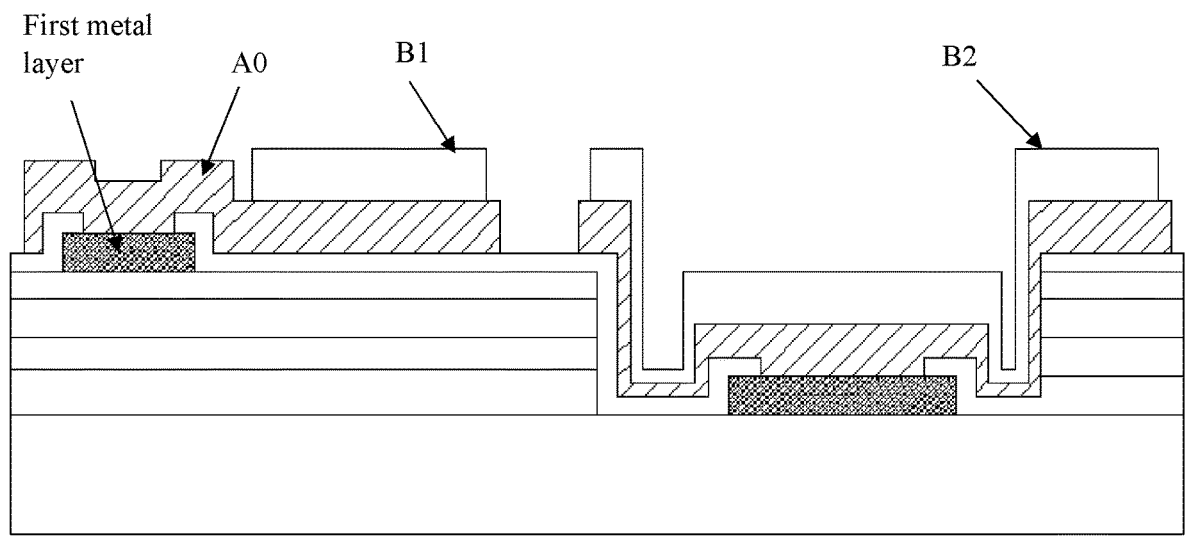
FIG. 10 illustrates a sectional view of a configuration where the second eutectic layer does not overlap with the first eutectic layer over the first metal layer according to some embodiments.

FIG. 10 illustrates a sectional view of a configuration where the second eutectic layer does not overlap with the first eutectic layer over the first metal layer according to some embodiments. As shown, the second eutectic layer at areas B1 and B2 would come into contact with package substrate directly, thereby facilitating the eutectic process. In addition, the thickness of areas B1 and B2 can be configured to be the same as area A0, further improving the eutectic contact.

In some embodiments, as illustrated in FIG. 10, the second eutectic layer does not overlap with the first metal layer and the first eutectic layer over the first metal layer. In addition, the second eutectic layer portion B1 and the first eutectic layer at area A0 can have a gap therebetween.

In another aspect, a light emitting diode is provided, including:

a light emitting structure includes a first semiconductor layer, a light emitting layer arranged on at least part of the first semiconductor layer, a second semiconductor layer arranged on the light emitting layer;

a first metal layer arranged on at least part of the first semiconductor layer and contact with the first semiconductor layer;

an electrode layer arranged over the light emitting structure, and has a first electrode layer and a second electrode layer, wherein the first electrode layer is electrical connected to the first semiconductor layer and the second semiconductor layer, the second electrode layer is available for bonding with a package substrate, and includes a first bonding region and a second bonding region, and the first bonding region is electrical connected to the first semiconductor layer and the second bonding region is electrical connected to the second semiconductor layer, wherein the first metal layer is not overlapped with the first bonding region of the second bonding region in vertical direction.

In some embodiments, the light emitting diode further includes a second metal layer arranged on at least of the second semiconductor layer and contact the second semiconductor layer.

In some embodiments, the second metal layer is not overlapped with the first bonding region of the second bonding region in vertical direction.

In some embodiments, the light emitting structure has a portion of defect region arranged in the second semiconductor layer, and extending downward to the first semiconductor layer to expose part of the first semiconductor layer, the first metal layer arranged on the portion of defect region.

In some embodiments, the portion of defect region is not overlapped with the first bonding region of the second bonding region in vertical direction.

In some embodiments, the light emitting structure has a surface away from the first semiconductor layer in vertical direction which having a first region and a second region, the first bonding region of the second electrode layer is arranged on the first region, the second bonding region of the second electrode layer is arranged on the second region.

In some embodiments, referring to FIG. 4, the first metal layer has a part 206b arranged on the first semiconductor layer corresponding to the second region of the surface, but is not overlapped with the second bonding region of the second electrode layer in the vertical direction.

In some embodiments, the first metal layer has another part 206a arranged on the first semiconductor layer corresponding to the first region of the surface, but is not overlapped with the first bonding region of the second electrode layer in vertical direction.

In some embodiments, the first metal layer having one part 206a arranged on the first semiconductor layer corresponding to the first region of the surface and an extension portion 206b extending from the first region of the surface to the second region of the surface, and the extension portion is not overlapped with the second bonding region of the second electrode layer in vertical direction.

In some embodiments, the light emitting diode further comprises a second metal layer arranged on the second semiconductor which having one part is corresponding to the first region of the surface, but is not overlapped with first the bonding region of the second electrode layer in vertical direction.

In some embodiments, the second metal layer has another one part corresponding to the second region of the surface, but is not overlapped with the second bonding region of the second electrode layer in vertical direction.

In some embodiments, the light emitting diode further comprises a second metal layer arranged on the second semiconductor which having one part corresponding to the first region of the surface and an extension portion extending from the second region of the surface to the first region of the surface, and the extension portion is not overlapped with the first bonding region of the second electrode layer in vertical direction.

In another aspect, a light emitting diode is provided, including:

a light emitting structure includes a first semiconductor layer, a light emitting layer arranged on at least part of the first semiconductor layer, a second semiconductor layer arranged on the light emitting layer, wherein the light emitting structure has a portion of defect region arranged in the second semiconductor layer, and extending downward to the first semiconductor layer to expose part of the first semiconductor layer, the first metal layer arranged on the portion of defect region;

an electrode layer arranged over the second semiconductor layer, and has a bonding region is available for bonding with a package substrate, wherein the bonding region includes a first bonding region electrically connected to the first semiconductor layer and a second bonding region electrically connected to the second semiconductor layer, and the portion of defect region is not overlapped with the first bonding region or the second bonding region in vertical direction.

In some embodiments, the light emitting structure has a surface away from the first semiconductor layer in vertical direction which having a first region and a second region, the first bonding region of the second electrode layer is arranged on the first region, the second bonding region of the second electrode layer is arranged on the second region.

In some embodiments, the light emitting diode further comprises a first metal layer arranged on the portion of defect region, which having one part 206a corresponding to the first region of the surface, and another part corresponding to the second region of the surface.

In some embodiments, referring to FIG. 4, the light emitting diode further includes a first metal layer having one part 206a arranged on the first semiconductor layer corresponding to the first region of the surface and an extension portion 206b extending from the first region of the surface to the second region of the surface, and the extension portion is not overlapped with the second bonding region of the second electrode layer in vertical direction.

In some embodiments, the light emitting diode further includes a second metal layer arranged on the second semiconductor which having one part is corresponding to the first region of the surface, but is not overlapped with first the bonding region of the second electrode layer in vertical direction.

In some embodiments, the second metal layer has another one part corresponding to the second region of the surface, but is not overlapped with the second bonding region of the second electrode layer in vertical direction.

In some embodiments, the light emitting diode further includes a second metal layer arranged on the second semiconductor which having one part corresponding to the first region of the surface and an extension portion extending from the second region of the surface to the first region of the surface, and the extension portion is not overlapped with the first bonding region of the second electrode layer in vertical direction.

In another aspect, a light emitting diode is provided, including:

a light emitting structure includes a first semiconductor layer, a light emitting layer arranged on at least part of the first semiconductor layer, a second semiconductor layer arranged on the light emitting layer;

a first metal layer arranged on at least part of the first semiconductor layer and contact with the first semiconductor layer;

an electrode layer arranged over the second semiconductor layer, and has a bonding region is available for bonding with a package substrate, wherein the bonding region includes a first bonding region electrically connected to the first semiconductor layer and a second bonding region electrically connected to the second semiconductor layer; and the first metal layer is not overlapped with first bonding region or the second bonding region in vertical direction.

In some embodiments, the light emitting diode can further include a second metal layer arranged over the second semiconductor layer and electrically connected to the second semiconductor layer.

In some embodiments, the light emitting diode can further include a transparent conducting layer arranged between the second semiconductor layer and the second metal layer.

In some embodiments, the light emitting diode can further include an insulating layer arranged between the second metal layer and the electrode layer.

In some embodiments, the second metal layer is not overlapped with first bonding region or the second bonding region in vertical direction.

In some embodiments, the first metal layer having a part 206a arranged on the first semiconductor layer corresponding to the first region of the surface and an extension portion 206b extending from the first region of the surface to the second region of the surface, as illustrated in FIG. 4.

In some embodiments, the first metal layer having a part 206a corresponding to the first region of the surface, and another part corresponding to the second region of the surface.

In another aspect, a light emitting diode is provided, as illustrated in FIG. 5, including:

a light emitting structure includes a first semiconductor layer, a light emitting layer arranged on at least part of the first semiconductor layer, a second semiconductor layer arranged on the light emitting layer;

a first metal layer arranged on at least part of the first semiconductor layer and contact with the first semiconductor layer;

a second metal layer arranged over at least of the second semiconductor layer and electrical contact the second semiconductor layer;

an electrode layer arranged over the light emitting structure, and includes a first region electrode layer 209 and a second region electrode layer 208, wherein the first region electrode layer contact with the first metal layer and the second region electrode layer contact with the second metal layer;

the electrode layer includes a first electrode layer and a second electrode layer, wherein the first electrode layer is contact with the first metal layer, the second electrode layer is available for bonding with a package substrate and not overlapped with the first metal layer or the second metal layer in vertical direction.

In another aspect, a light emitting diode is provided, including:

a light emitting structure includes a first semiconductor layer, a light emitting layer arranged on at least part of the first semiconductor layer, a second semiconductor layer arranged on the light emitting layer, wherein the light emitting structure has a surface away from the first semiconductor layer in vertical direction which having a first region and a second region;

a first metal layer arranged on at least part of the first semiconductor layer and contact with the first semiconductor layer;

a second metal layer arranged over at least of the second semiconductor layer and electrical contact the second semiconductor layer;

an electrode layer arranged over the surface and includes a first region electrode layer 209 and a second region electrode layer 208, wherein the first region electrode layer arranged on the first region of the surface and the second region electrode layer arranged on the second region of the surface;

wherein the electrode layer has a bonding region is available for bonding with a package substrate, and the bonding region not overlapped with the first metal layer or the second metal layer in vertical. direction.

In another aspect, a light emitting diode is provided, including:

a light emitting structure includes a first semiconductor layer, a light emitting layer arranged on at least part of the first semiconductor layer, a second semiconductor layer arranged on the light emitting layer;

a first metal layer arranged on at least part of the first semiconductor layer and contact with the first semiconductor layer;

an insulating layer covered a surface of a light emitting structure;

an electrode layer arranged on the insulating layer and has at least one region not overlapped with the first metal layer or the second metal layer in the vertical direction.

In some embodiments, the electrode layer includes a first region electrode layer which arranged on the insulating layer and contacts with the first metal layer via one opening structure in the insulating layer, the first region electrode layer have at least one region is not overlapped with the first metal layer.

In some embodiments, referring to FIG. 7, the first region electrode layer includes a metal contact region 3091A which is in contact with the first metal layer in vertical direction, a non-metal contact region 3091B which is not in contact with the first metal layer in vertical direction, and the non-metal contact region is not overlapped with the first metal layer in vertical direction.

In some embodiments, the non-metal contact region of the first region electrode layer is not overlapped with the metal contact region of the first region electrode layer in vertical direction.

In some embodiments, referring to FIG. 6, the non-metal contact region of the first region electrode layer is extended in the vertical direction to form a bonding region, the bonding region is contact with at least part of a package substrate, the bonding region is not overlapped with the first metal layer in the vertical direction.

In some embodiments, the electrode layer include a second region electrode layer;

the second region electrode layer arranged on at least part of the insulating layer and contact with the second metal layer via one opening structure in the insulating layer, the second region electrode layer have at least one region not overlapped with the second metal layer.

In some embodiments, the second region electrode layer include a metal contact region which contact with the second metal layer in vertical direction, and, a non-metal contact region which is not contact with the second metal layer in vertical direction, and, the non-metal contact region is not overlapped with the second metal layer in vertical direction.

In some embodiments, the non-metal contact region of the second region electrode layer is not overlapped with the metal contact region of the second region electrode layer in vertical direction.

In some embodiments, the second semiconductor layer is a P type semiconductor layer, the first semiconductor layer is a N type semiconductor layer.

In some embodiments, the metal layer material is Cr, Ti, Pt, Au, Ag, Ni, Cu, TiW or any of their combinations.

In some embodiments, wherein, the insulating layer material is $SiO_2$, $Al_2O_3$, $SiN_X$, $TiO_2$ or any of their combinations.

In some embodiments, the electrode layer material is Ti, Ni, Cu, Au, AuSn, SnCu, SnBi or any of their combinations.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light emitting diode, comprising:
a light emitting structure including a first semiconductor layer, a light emitting layer arranged on at least part of the first semiconductor layer, a second semiconductor layer arranged on the light emitting layer;
a first metal layer arranged on at least part of the first semiconductor layer and contact with the first semiconductor layer; and
an electrode layer arranged over the second semiconductor layer, and has a bonding region is available for bonding with a package substrate, wherein the bonding region includes a first bonding region electrically connected to the first semiconductor layer and a second bonding region electrically connected to the second semiconductor layer; and the first metal layer is not overlapped with first bonding region or the second bonding region in a vertical direction.

2. A light emitting diode, comprising:
a light emitting structure including a first semiconductor layer, a light emitting layer arranged on at least part of the first semiconductor layer, a second semiconductor layer arranged on the light emitting layer, wherein the light emitting structure has a portion of defect region arranged in the second semiconductor layer, and extending downward to the first semiconductor layer to expose part of the first semiconductor layer, a first metal layer arranged on the portion of defect region; and an electrode layer arranged over the second semiconductor layer, and has a bonding region is available for bonding with a package substrate, wherein the bonding region includes a first bonding region electrically connected to the first semiconductor layer and a second bonding region electrically connected to the second semiconductor layer, and the portion of defect region is not overlapped with the first bonding region or the second bonding region in a vertical direction.

3. The light emitting diode of claim 2, wherein the light emitting structure has a surface distal from the first semiconductor layer in vertical direction which having a first region and a second region, the first bonding region of a second electrode layer is arranged on the first region, the second bonding region of the second electrode layer is arranged on the second region.

4. The light emitting diode of claim 3, further comprising a second metal layer arranged on the second semiconductor layer having one part corresponding to the first region of the surface and an extension portion extending from the second region of the surface to the first region of the surface, and the extension portion is not overlapped with the first bonding region of the second electrode layer in vertical direction.

5. The light emitting diode of claim 3, further comprising a first metal layer having one part arranged on the first semiconductor layer corresponding to the first region of the surface and an extension portion extending from the first region of the surface to the second region of the surface, and the extension portion is not overlapped with the second bonding region of the second electrode layer in vertical direction.

6. The light emitting diode of claim 3, further comprising a first metal layer arranged on the portion of defect region, which having one part corresponding to the first region of the surface, and another part corresponding to the second region of the surface.

7. The light emitting diode of claim 3, further comprising a second metal layer arranged on the second semiconductor layer having one part is corresponding to the first region of the surface, but is not overlapped with first the bonding region of the second electrode layer in vertical direction.

8. The light emitting diode of claim 7, wherein the second metal layer has another one part corresponding to the second region of the surface, but is not overlapped with the second bonding region of the second electrode layer in the vertical direction.

9. A light emitting diode, comprising:
a light emitting structure including a first semiconductor layer, a light emitting layer arranged on at least part of the first semiconductor layer, a second semiconductor layer arranged on the light emitting layer;
a first metal layer arranged on at least a portion of the first semiconductor layer and in contact with the first semiconductor layer; and
an electrode layer arranged over the light emitting structure, and having a first electrode layer and a second electrode layer, wherein:
the first electrode layer is electrically coupled to the first semiconductor layer and the second semiconductor layer;

the second electrode layer is configured for bonding with a package substrate, and includes a first bonding region and a second bonding region;
the first bonding region is electrically coupled to the first semiconductor layer;
the second bonding region is electrically coupled to the second semiconductor layer; and
the first metal layer is not overlapped with the first bonding region or the second bonding region in a vertical direction.

10. The light emitting diode of claim 9, wherein the second metal layer is not overlapped with the first bonding region or the second bonding region in the vertical direction.

11. The light emitting diode of claim 9, further comprising a second metal layer arranged on at least of the second semiconductor layer and contact the second semiconductor layer.

12. The light emitting diode of claim 9, wherein the light emitting structure has a portion of defect region arranged in the second semiconductor layer, and extending downward to the first semiconductor layer to expose part of the first semiconductor layer, the first metal layer arranged on the portion of defect region.

13. The light emitting diode of claim 12, wherein the portion of defect region is not overlapped with the first bonding region or the second bonding region in the vertical direction.

14. The light emitting diode of claim 9, wherein the light emitting structure has a surface distal from the first semiconductor layer in a vertical direction and having a first region and a second region, the first bonding region of the second electrode layer is arranged on the first region, the second bonding region of the second electrode layer is arranged on the second region.

15. The light emitting diode of claim 14, wherein the first metal layer having one part arranged on the first semiconductor layer corresponding to the first region of the surface and an extension portion extending from the first region of the surface to the second region of the surface, and the extension portion is not overlapped with the second bonding region of the second electrode layer in the vertical direction.

16. The light emitting diode of claim 14, wherein, further comprising a second metal layer arranged on the second semiconductor layer having one part corresponding to the first region of the surface and an extension portion extending from the second region of the surface to the first region of the surface, and the extension portion is not overlapped with the first bonding region of the second electrode layer in the vertical direction.

17. The light emitting diode of claim 14, further comprising a second metal layer arranged on the second semiconductor layer having one part is corresponding to the first region of the surface, but is not overlapped with first the bonding region of the second electrode layer in the vertical direction.

18. The light emitting diode of claim 17, wherein the second metal layer has another one part corresponding to the second region of the surface, but is not overlapped with the second bonding region of the second electrode layer in the vertical direction.

19. The light emitting diode of claim 14, wherein the first metal layer having one part arranged on the first semiconductor layer corresponding to the second region of the surface, but is not overlapped with the second bonding region of the second electrode layer in the vertical direction.

20. The light emitting diode of claim 19, wherein, the first metal layer has another one part arranged on the first semiconductor layer corresponding to the first region of the surface, but is not overlapped with the first bonding region of the second electrode layer in the vertical direction.

\* \* \* \* \*